(12) United States Patent
Tamai

(10) Patent No.: US 6,819,387 B1
(45) Date of Patent: Nov. 16, 2004

(54) LIQUID-CRYSTAL-PANEL DRIVER IC PACKAGE, AND LIQUID CRYSTAL PANEL MODULE

(75) Inventor: Shigeki Tamai, Yoshino-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/472,816

(22) Filed: Dec. 28, 1999

(30) Foreign Application Priority Data

Jan. 4, 1999 (JP) .......................................... 11-000124

(51) Int. Cl.[7] .......................................... G02F 1/1345
(52) U.S. Cl. ........................................ 349/149; 349/152
(58) Field of Search .......................... 349/149–152; 361/748

(56) References Cited

U.S. PATENT DOCUMENTS

| 5,362,547 | A | * | 11/1994 | Yamazaki | .................... | 428/167 |
| 5,748,179 | A | * | 5/1998 | Ito et al. | ..................... | 349/152 |
| 6,191,471 | B1 | * | 2/2001 | Tamai et al. | ................. | 257/678 |

FOREIGN PATENT DOCUMENTS

| JP | 5-297394 A | 11/1993 |
| JP | 5-323355 A | 12/1993 |
| JP | 6-3684 | 1/1994 |
| JP | 7-231009 A | 8/1995 |
| JP | 10-214858 A | 8/1998 |
| JP | 1-251079 | * 10/1998 |

* cited by examiner

*Primary Examiner*—Dung Nguyen
(74) *Attorney, Agent, or Firm*—Nixon & Vanderhye, P.C.

(57) ABSTRACT

There are provided a liquid-crystal-panel driver IC package which can be mounted compactly on a liquid crystal panel without using any fixing jigs, as well as a liquid crystal panel module which can be downsized by reducing its picture-frame size. First, second glass substrates 31, 32 are laminated together with a specified spacing so as to seal liquid crystals therebetween, and to form a step region A. A plurality of liquid-crystal-panel driver IC TCPs each of which is bent at a bending slit and folded are continuously disposed so as to be arrayed along the step region A. Output leads of the liquid-crystal-panel driver IC TCPs are electrically connected to liquid-crystal driving wiring 35 provided in the step region A of the first, second glass substrates 31, 32. Then, input-lead side connecting slits of mutually adjoining liquid-crystal-panel driver IC TCPs are superimposed on each other, so that the input leads are electrically connected to each other by soldering or the like at the connecting slits.

6 Claims, 9 Drawing Sheets

US 6,819,387 B1

LIQUID-CRYSTAL-PANEL DRIVER IC PACKAGE, AND LIQUID CRYSTAL PANEL MODULE

BACKGROUND OF THE INVENTION

The present invention relates to liquid-crystal-panel driver IC (Integrated Circuit) packages for driving a liquid crystal panel, and to liquid crystal panel modules.

It has often been the case, conventionally, that a liquid-crystal-panel driver IC for driving a liquid crystal panel is mounted on a liquid crystal panel in the form of a liquid-crystal-panel driver IC TCP (Tape Carrier Package), which is a form of semiconductor device package. FIG. 10 shows a plan view of a liquid crystal panel module on which such a liquid-crystal-panel driver IC TCP is mounted. As shown in FIG. 10, a plurality of liquid-crystal-panel driver IC TCPs 102 are mounted on opposite two longer-edge sides of a liquid crystal panel 101. The liquid-crystal-panel driver IC TCP 102 comprises a semiconductor chip 103, outer leads (not shown) on the output-terminal side, and outer leads (not shown) on the input-terminal side. The output-terminal side outer leads of the liquid-crystal-panel driver IC TCP 102 are connected to the liquid crystal panel 101, while the input-terminal side outer leads of the liquid-crystal-panel driver IC TCP 102 are connected to an input connection board 104 (flexible board or printed board). The individual liquid-crystal-panel driver IC TCP 102 serves for signal transmission of clock signals, synchronization signals and the like as well as for power supply via interconnection lines (not shown) on this input connection board 104.

In recent years, because of the market's demands for more lightweight, thinner, shorter and smaller products, downsizing has become indispensable also for the liquid-crystal-panel driver IC TCPs to be mounted onto liquid crystal panels. As a response to such demands, the present applicant has proposed a liquid-crystal-panel driver IC TCP as described in Japanese Patent Laid-Open Publication HEI 6-3684.

FIG. 11 shows a plan view of the liquid-crystal-panel driver IC TCP described in the Publication HEI 6-3684. This liquid-crystal-panel driver IC TCP is designed to perform transmission of clock signals, synchronization signals and the like as well as power supply by making use of the interconnection lines within a liquid crystal driver chip 117. In this liquid-crystal-panel driver IC TCP, a rectangular-shaped liquid crystal driver chip 117 is mounted on a base tape 101, output leads 115 are provided on the base tape 101 on one longer-edge side of the liquid crystal driver chip 117, and input leads 111, 112 each transmitting signals S1–S7 are provided on the other opposite two shorter-edge sides of the liquid crystal driver chip 117 on the base tape 101. Then, the liquid-crystal-panel driver IC TCPs are disposed so as to adjoin the liquid crystal panel, while a slit 113 having the input leads 111 and connecting leads 114 of the input leads 112 of the liquid-crystal-panel driver IC TCP are overlaid on each other so that the input leads 111, 112 of liquid-crystal-panel driver IC TCPs are connected to each other. This makes it possible to perform signal transmission and power supply to the individual liquid-crystal-panel driver IC TCPs, thereby eliminating the input connection board (flexible board or printed board) 104 shown in FIG. 10. Thus, the picture-frame size of the liquid crystal panel module can be reduced.

However, along with growing demands for even more lightweight, thinner, shorter and smaller liquid crystal panel modules, the liquid-crystal-panel driver IC is further advancing in size reduction and slimming in thickness. On this account, there have arisen needs for mounting liquid-crystal-panel driver IC TCPs, on each of which a liquid-crystal-panel driver IC is mounted, further compactly on the liquid crystal panel, as well as for further reducing the picture-frame size of the liquid crystal panel module.

Therefore, it would be conceived, as one method for reducing the picture-frame size of the liquid crystal panel module, to bend the liquid-crystal-panel driver IC TCP by 90°. In this case, however, there are problems that the liquid crystal panel module would become thicker while jigs for securing this bent liquid-crystal-panel driver IC TCP would be necessitated. Moreover, there are fears that when the bent liquid-crystal-panel driver IC TCP is led around and fixed to the rear face side of backlight or the like, the liquid-crystal-panel driver IC TCP could not be fixed until all the components and units such as the backlight are integrated together, and that the liquid-crystal-panel driver IC TCP might be damaged by the bending or other work.

Accordingly, an object of the present invention is to provide a liquid-crystal-panel driver IC package which can be mounted compactly on a liquid crystal panel without using any fixing jigs, and to provide a liquid crystal panel module which can be downsized by reducing the picture-frame size with the use of the liquid-crystal-panel driver IC package.

SUMMARY OF THE INVENTION

In order to achieve the above object, according to this invention, there is provided a liquid-crystal-panel driver IC package comprising:

an insulative base;
a liquid-crystal-panel driver IC mounted on the insulative base;
output leads which are provided on the insulative base on one side of the liquid-crystal-panel driver IC, and which are connected to the liquid-crystal-panel driver IC; and
input leads which are provided on the insulative base on the other side of the liquid-crystal-panel driver IC, and which are connected to the liquid-crystal-panel driver IC, wherein
a bending slit is provided on part of the insulative base where the output leads are provided such that the output leads remain in the bending slit.

According to this liquid-crystal-panel driver IC package, the bending slit is provided while the output leads (wiring patterns) are left on the output leads side of the insulative base on which the liquid-crystal-panel driver IC is mounted, and the insulative base is bent over at the bending slit. For example, the insulative base is bent over so that main parts of the output leads to be connected to the liquid crystal panel are positioned on the rear side and that the liquid-crystal-panel driver IC and the input leads are positioned on the front side, then the main parts of the output leads are connected to the wiring of the liquid crystal panel, and the resulting liquid-crystal-panel driver IC package is mounted on the liquid crystal panel. Thus, the liquid-crystal-panel driver IC package can be mounted in the bent state compactly on the liquid crystal panel.

In one embodiment, the insulative base is a base tape.

According to this liquid-crystal-panel driver IC package, since the insulative base is the base tape, the bending of the base tape at the bending slit can be easily achieved.

Also, in one embodiment, the insulative base is a flexible board.

According to this embodiment, since the insulative base is the flexible board, there are no device holes into which resin mold is filled for protecting the output leads and the input leads (writing patterns) as well as the bumps of the liquid-crystal-panel driver IC to which those wiring patterns are connected, as would be involved in the case of the base tape, making the liquid-crystal-panel driver IC package easier to handle. Besides, since there are no swells of the resin mold to be filled into such a device hole, upper and lower parts of the flexible board are laid on each other in a just fit when the flexible board is bent. Thus, the liquid-crystal-panel driver IC package can be made lower in height and mounted more compactly.

Also, in one embodiment, the input leads are first input leads and second input leads which are respectively provided on the insulative base so as to extend bilaterally outwardly generally perpendicularly to a direction in which the output leads extend from the liquid-crystal-panel driver IC, and connecting slits are respectively provided on parts of the insulative base where the first and second input leads are provided, respectively, such that the first and second input leads are exposed in the connecting slits.

According to this embodiment, when this liquid-crystal-panel driver IC packages are set to the liquid crystal panel so as to make an array in some plural number, parts of the insulative bases having the first and second input leads of mutually adjoining liquid-crystal-panel driver IC packages are laid on each other. Then, the first input leads and second input leads of the liquid-crystal-panel driver IC packages are electrically connected to each other at the connecting slits provided on the insulative bases. Thus, the need for the connection board such as a flexible board or a printed board is eliminated, so that the liquid-crystal-panel driver IC package can be further downsized and reduced in cost.

Also, in one embodiment, the input leads are first input leads and second input leads which are respectively provided on the insulative base so as to extend bilaterally outwardly generally perpendicularly to a direction in which the output leads extend from the liquid-crystal-panel driver IC, a connecting slit is provided on one part of the insulative base where the first input leads are provided such that the first input leads are exposed in the connecting slit, and a resist-uncoated connecting portion is provided on the other part of the insulative base where the second input leads are provided.

According to this embodiment, when this liquid-crystal-panel driver IC packages are set to the liquid crystal panel so as to make an array in some plural number, parts of the insulative bases having the first and second input leads of mutually adjoining liquid-crystal-panel driver IC packages are laid on each other. In this case, laying their parts on each other with their connecting slit side up makes the connection by solder or the like easier. Then, the first-input leads and the second input leads of the individual liquid-crystal-panel driver IC packages are electrically connected to each other at the connecting slit provided on the first input leads side of the insulative base and the resist-uncoated connecting portion provided on the second input leads side. Thus, the need for the connection board such as a flexible board or a printed board is eliminated, so that the liquid-crystal-panel driver IC package can be further downsized and reduced in cost. Besides, the provision of the resist-uncoated connecting portion on the second input leads side of the insulative base prevents disconnections of the first input leads and the second input leads at the connecting slit and the resist-uncoated connecting portion. Thus, the liquid-crystal-panel driver IC package can be further improved in reliability and made easier to handle.

Also, in one embodiment, the liquid-crystal-panel driver IC has two identical-signal terminals to which the first and second input leads are connected, respectively, and the two identical-signal terminals are electrically connected to each other within the liquid-crystal-panel driver IC.

According to this embodiment, since the two identical-signal terminals to which the first input leads and the second input leads are connected, respectively, are electrically connected to each other within the liquid-crystal-panel driver IC, the first input leads and the second input leads of the liquid-crystal-panel driver IC packages can be connected to each other via the liquid-crystal-panel driver ICs without any connecting lines when this liquid-crystal-panel driver IC package is set to the liquid crystal panel so as to make an array in some plural number.

Also, in one embodiment, there is provided a liquid crystal panel module which comprises:

a first glass substrate and a second glass substrate laminated together with a specified spacing so as to seal liquid crystals therebetween, and to form, on at least one edge side of the first, second glass substrates, a step region for setting therein the liquid-crystal-panel driver IC packages in which each insulative base is bent at the bending slit and folded;

liquid-crystal driving wiring which is provided in the step region of the first, second glass substrates, and to which the output leads of the individual liquid-crystal-panel driver IC packages disposed so as to be arrayed along the step region are electrically connected; and a connection board which has connecting lines serving for connecting the input leads of each liquid-crystal-panel driver IC package to each other, and which is disposed on each liquid-crystal-panel driver IC package.

According to the liquid crystal panel module of this embodiment, the first glass substrate and the second glass substrate-are laminated together with a specified spacing so as to seal liquid crystals therebetween, and liquid-crystal driving wiring is provided in the step region formed on at least one edge side of the first, second glass substrates. The liquid-crystal-panel driver IC packages, in each of which the insulative base is bent over at the bending slit and folded, are disposed so as to be arrayed along the step region. The output leads of the individual liquid-crystal-panel driver IC packages are connected to the liquid-crystal driving wiring of the step region. Then, the connection board is disposed on the liquid-crystal-panel driver IC packages, and the input leads of the individual liquid-crystal-panel driver IC packages are electrically connected to each other by the connecting lines of the connection board. With this arrangement, signal transmission of clock signals, synchronization signals and the like as well as power supply are implemented via the connecting lines of the connection board. Therefore, the liquid-crystal-panel driver IC packages can be mounted compactly on the liquid crystal panel formed of the first, second glass substrates without using any fixing jigs. Thus, a liquid crystal panel module that can be downsized by reducing the picture-frame size can be provided.

Also, in one embodiment, there is provided a liquid crystal panel module which comprises:

a first glass substrate and a second glass substrate laminated together with a specified spacing so as to seal liquid crystals therebetween, and to form, on at least one edge side of the first, second glass substrates, a step region for setting therein the liquid-crystal-panel driver IC packages in which each insulative base is bent at the bending slit and folded; and liquid-crystal driving wiring which is provided in the step region of the first, second glass substrates, and to which the output leads of the individual liquid-crystal-panel driver IC packages disposed so as to be arrayed along the step region are electrically connected, wherein the connecting slits of mutually adjoining liquid-crystal-panel driver IC packages are superimposed on each other so that the first input leads and second input leads of the liquid-crystal-panel driver IC packages are electrically connected to each other at the connecting slits.

According to the liquid crystal panel module of this embodiment, the first glass substrate and the second glass substrate are laminated together with a specified spacing so as to seal liquid crystals therebetween, and the liquid-crystal driving wiring is provided in the step region formed on at least one edge side of the first, second glass substrates. The liquid-crystal-panel driver IC packages, in each of which the insulative base is bent over at the bending slit and folded, are disposed so as to be arrayed along the step region. The output leads of the individual liquid-crystal-panel driver IC packages are connected to the liquid-crystal driving wiring of the step region. Then, the connecting slits of mutually adjoining liquid-crystal-panel driver IC packages are laid on each other, so that the first input leads and the second input leads of the liquid-crystal-panel driver IC packages are electrically connected to each other at the connecting slits. With this arrangement, signal transmission of clock signals, synchronization signals and the like as well as power supply are implemented. Therefore, the liquid-crystal-panel driver IC packages can be mounted compactly on the liquid crystal panel formed of the first, second glass substrates without using any fixing jigs, allowing the liquid crystal panel module to be downsized by reducing the picture-frame size. Also, the connecting slits of mutually adjoining liquid-crystal-panel driver IC packages are laid on each other, so that the first input leads and the second input leads of the liquid-crystal-panel driver IC packages are electrically connected to each other at the connecting slits. Thus, the need for the connection board such as a flexible board or a printed board is eliminated, and the liquid crystal panel module can be further downsized and reduced in cost.

Also, in one embodiment, there is provided a liquid crystal panel module which comprises:

a first glass substrate and a second glass substrate laminated together with a specified spacing so as to seal liquid crystals therebetween, and to form, on at least one edge side of the first, second glass substrates, a step region for setting therein the liquid-crystal-panel driver IC packages in which each insulative base is bent at the bending slit and folded; and liquid-crystal driving wiring which is provided in the step region of the first, second glass substrates, and to which the output leads of the individual liquid-crystal-panel driver IC packages disposed so as to be arrayed along the step region are electrically connected, wherein the connecting slit and the resist-uncoated connecting portion of mutually adjoining liquid-crystal-panel driver IC packages are superimposed on each other so that the first input leads and second input leads of the liquid-crystal-panel driver IC packages are electrically connected to each other at the connecting slits and the resist-uncoated connecting portions.

According to the liquid crystal panel module of this embodiment, the first glass substrate and the second glass substrate are laminated together with a specified spacing so as to seal liquid crystals therebetween, and liquid-crystal driving wiring is provided in the step region formed on at least one edge side of the first, second glass substrates. The liquid-crystal-panel driver IC packages, in each of which the insulative base is bent over at the bending slit and folded, are disposed so as to be arrayed along the step region. The output leads of the individual liquid-crystal-panel driver IC packages are connected to the liquid-crystal driving wiring of the step region. Then, the connecting slits and the resist-uncoated connecting portions of mutually adjoining liquid-crystal-panel driver IC packages are laid on each other so that the first input leads and the second input leads of the mutually adjoining liquid-crystal-panel driver IC packages are electrically connected to each other at the connecting slits and the resist-uncoated connecting portions. By so doing, signal transmission of clock signals, synchronization signals and the like as well as power supply are implemented. Therefore, the liquid-crystal-panel driver IC packages can be mounted compactly on the liquid crystal panel formed of the first, second glass substrates without using any fixing jigs, and the liquid crystal panel module can be downsized by reducing its picture-frame size. Also, the parts of the insulative base having the first input leads and the second input leads of mutually adjoining liquid-crystal-panel driver IC packages are overlaid on each other, and the first input leads and the second input leads are electrically connected to each other at the connecting slits and the resist-uncoated connecting portions. With this arrangement, signal transmission of clock signals, synchronization signals and the like as well as power supply are implemented. Therefore, the liquid-crystal-panel driver IC packages can be mounted compactly on the liquid crystal panel formed of the first, second glass substrates without using any fixing jigs. Thus, the liquid crystal panel module can be downsized by reducing the picture-frame size. Also, the first input leads and the second input leads are electrically connected to each other at the connecting slits and the resist-uncoated connecting portions. Thus, the need for the connection board such as a flexible board or a printed board is eliminated, so that the liquid crystal panel module can be further downsized and reduced in cost. Moreover, since the liquid-crystal-panel driver IC package has the resist-uncoated connecting portion provided on the second input leads side of the insulative base, disconnections of the second input leads where this resist-uncoated connecting portion is provided can be prevented, and the liquid crystal panel module can be further improved in reliability and made easier to handle.

Also, in one embodiment, the liquid-crystal-panel driver IC packages are placed within the step region of the first, second glass substrates.

According to the liquid crystal panel module of this embodiment, since the liquid-crystal-panel driver IC packages are placed in the step region of the first, second glass substrates, the liquid crystal panel module can be further downsized.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the liquid-crystal-panel driver IC package and the liquid crystal panel module according to the present invention are described in detail by embodiments thereof illustrated in the accompanying drawings.

(First Embodiment)

Figure 1:
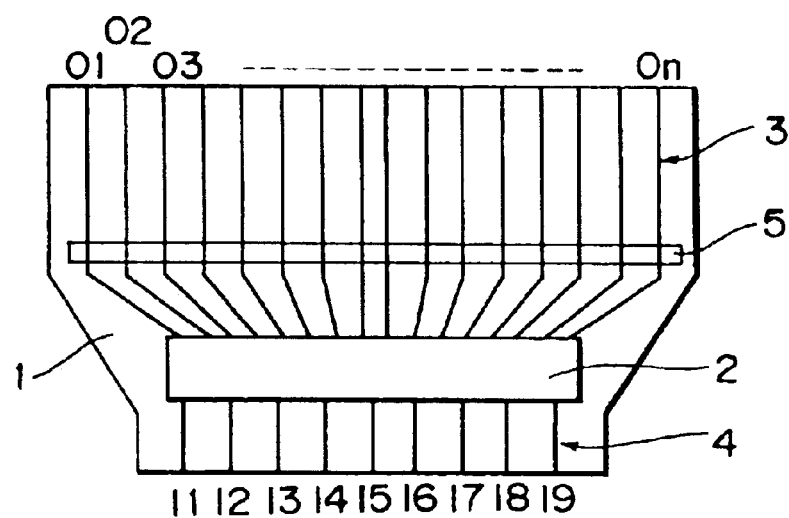
FIG. 1 is a plan view of a liquid-crystal-panel driver IC TCP to be used for a liquid crystal panel module according to a first embodiment of the present invention.

FIG. 1 is a plan view of a liquid-crystal-panel driver IC TCP (Tape Carrier Package) to be mounted on a liquid crystal panel module according to a first embodiment of the present invention. There are shown in this figure: a base tape 1 as an insulative base; a rectangular-shaped liquid crystal driver chip 2 as a liquid-crystal-panel driver IC mounted on the base tape 1; output leads 3 (output signals: O1–On) including inner leads and outer leads provided on one longer-edge side of the liquid crystal driver chip 2 on the base tape 1; and input leads 4 (input signals: I1–I9) including inner leads and outer leads provided on the other longer-edge side of the liquid crystal driver chip 2 on the base tape 1. A bending slit 5 is provided longitudinally of the liquid crystal driver chip 2 on the output leads 3 side generally in the center of the base tape 1. Then, the base tape 1 of this liquid-crystal-panel driver IC TCP is bent 180 degrees at the bending slit 5 and laid on each other so that the liquid crystal driver chip 2 is positioned on the front side.

Figure 2:
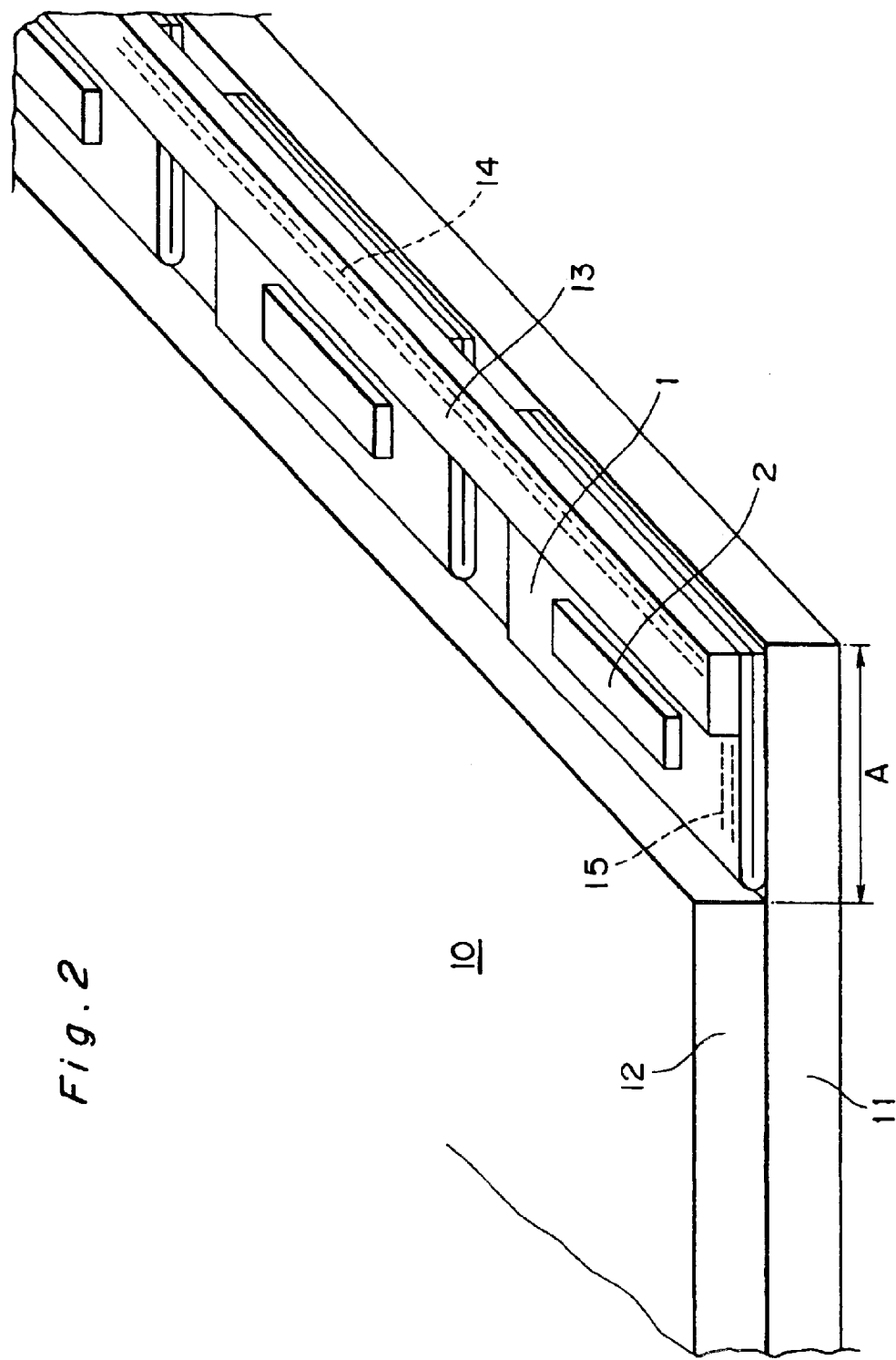
FIG. 2 is a perspective view of main part of the liquid crystal panel module in which the liquid-crystal-panel driver IC TCPs are mounted.

FIG. 2 is a perspective view of main part showing a state in which the bent liquid-crystal-panel driver IC TCPs are mounted on the liquid crystal panel.

As shown in FIG. 2, a first glass substrate 11 and a second glass substrate 12 are laminated together with a specified spacing so as to seal liquid crystals therebetween, and to form a step region A for placing therein the liquid-crystal-panel driver IC TCPs, by which a liquid crystal panel 10 is formed up. Wiring 15 for driving liquid crystals is provided in the step region A of the first, second glass substrates 11, 12, and the liquid-crystal driving wiring 15 and the output leads 3 (shown in FIG. 1) of the liquid-crystal-panel driver IC TCP are connected to each other via anisotropic conductive film (not shown).

Meanwhile, the input leads 4 (shown in FIG. 1) of the liquid-crystal-panel driver IC TCP are connected to interconnection wiring 14 provided on an input connection board 13 formed of a flexible board or a printed board, and performs signal transmission and power supply via the interconnection wiring 14 of the input connection board 13.

Also, as shown in FIG. 2, the liquid-crystal-panel driver IC TCP is connected to the step region A so that the bending slit 5 (shown in FIG. 1) is directed toward the center of the liquid crystal panel 10. Such a connection method makes it possible to utilize a length of the outer leads 3 of the liquid-crystal-panel driver IC TCP ranging from the bending slit 5 to ends of the output leads 3, i.e., an about ½ length of the liquid-crystal-panel driver IC TCP, for the connection with the liquid-crystal driving wiring 15 of the liquid crystal panel 10. Thus, the connection reliability is improved and the step region A of the first, second glass substrates 11, 12 can be reduced in size.

Like this, it becomes possible to mount the liquid-crystal-panel driver IC TCPs compactly in a bent state on the liquid crystal panel 10 formed of the first, second glass substrates 11, 12. Therefore, the liquid-crystal-panel driver IC TCPs can be mounted compactly on the liquid crystal panel 10 without using any fixing jigs, and the liquid crystal panel module can be downsized by reducing the picture-frame size.

Also, since the liquid-crystal-panel driver IC TCPs are placed within the step region A of the first, second glass substrates 11, 12, the liquid crystal panel module can be further downsized.

Moreover, since the base tape 1 is used as the insulative base, the bending of the base tape 1 at the bending slit 5 can be easily achieved.

(Second Embodiment)

Figure 3:
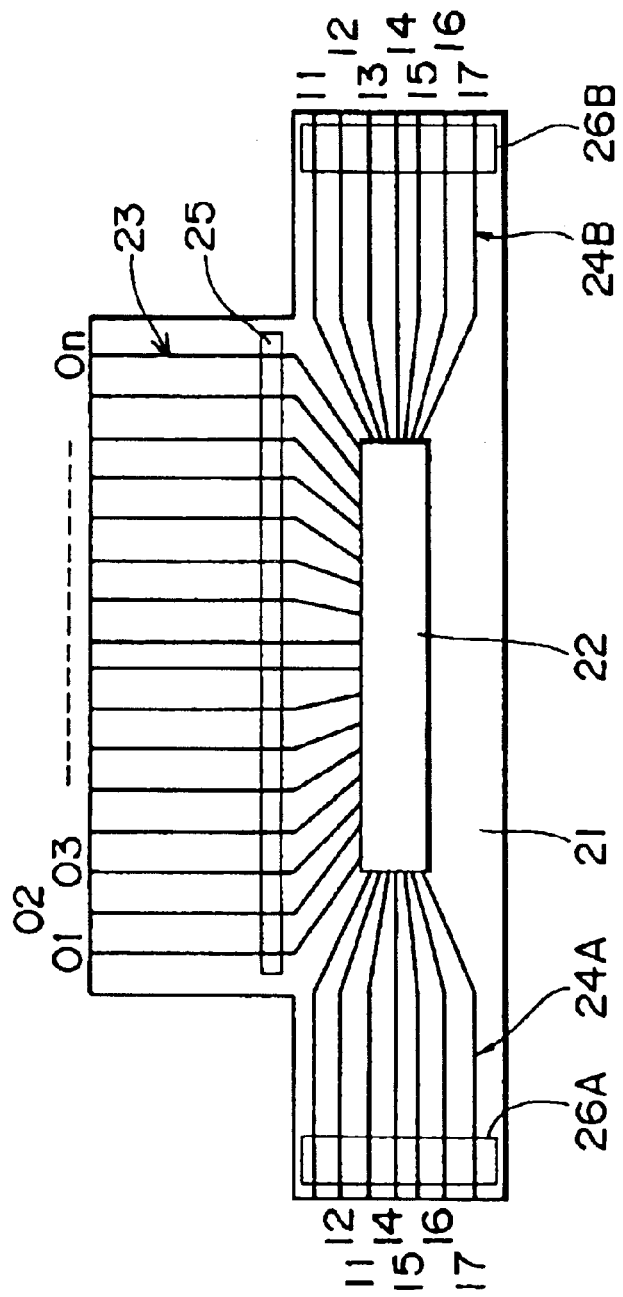
FIG. 3 is a plan view of a liquid-crystal-panel driver IC TCP to be used for a liquid crystal panel module according to a second embodiment of the present invention.

FIG. 3 is a plan view of a liquid-crystal-panel driver IC TCP to be mounted on a liquid crystal panel module according to a second embodiment of the present invention. There are shown in this figure: a base tape 21 of an upset T shape as an insulative base; a rectangular-shaped liquid crystal driver chip 22 as a liquid-crystal-panel driver IC mounted on the base tape 21; output leads 23 (output signals: O1–On) including inner leads and outer leads provided on one longer-edge side of the liquid crystal driver chip 22 on the base tape 21; and input leads 24A, 24B (input signals: I1–I7) including inner leads and outer leads provided on opposite both shorter-edge sides of the liquid crystal driver chip 22 on the base tape 21. A bending slit 25 is provided longitudinally of the liquid crystal driver chip 22 on the output leads 23 side generally in the center of the base tape 21, while connecting slits 26A, 26B are provided on the input leads 24A, 24B sides of the base tape 21 along the shorter edges of the liquid crystal driver chip 22. The outer leads of the input leads 24A, 24B extend outwardly generally perpendicularly to a direction in which the outer leads of the output leads 23 extends from the liquid crystal driver chip 22. The outer leads of the input leads 24A, 24B in the connection slits 26A, 26B can be made directly connectable to each other through soldering or other process by preparing a design that when liquid-crystal-panel driver IC TCPs are mounted on a later-described liquid crystal panel, mutually adjoining liquid-crystal-panel driver IC TCPs overlap each other at the connecting slits 26A, 26B. Meanwhile, identical-signal terminals of the liquid crystal driver chip 22, to which the inner leads of the input leads 24A, 24B are connected, are electrically connected by internal wiring of the liquid crystal driver chip 22. Then, the base tape 21 of the liquid-crystal-panel driver IC TCP is bent 180 degrees at the bending slit 25 and laid on each other so that the liquid crystal driver chip 22 is positioned on the front side.

Figure 4:
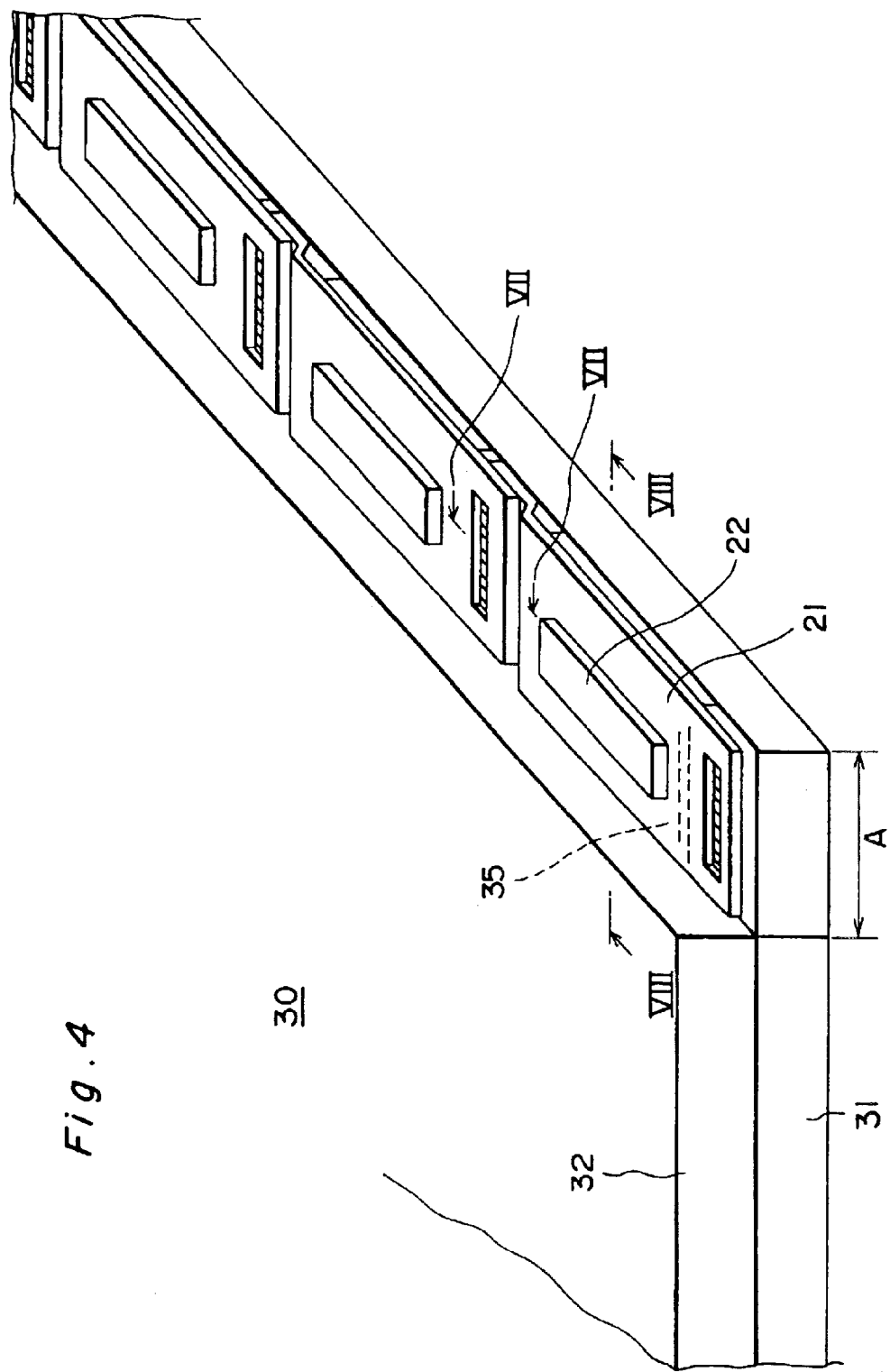
FIG. 4 is a perspective view of main part of a liquid crystal panel module in which the liquid-crystal-panel driver IC TCPs are mounted.

FIG. 4 shows a state in which the bent liquid-crystal-panel driver IC TCPs are mounted on a liquid crystal panel. In FIG. 4, wiring patterns of the output leads and the input leads in the liquid-crystal-panel driver IC TCP are omitted for an easier viewing.

As shown in FIG. 4, a first glass substrate 31 and a second glass substrate 32 are superimposed together with a specified spacing so as to seal liquid crystals therebetween and to form a step region A for setting the liquid-crystal-panel driver IC TCPs, by which a liquid crystal panel 30 is formed. Wiring 35 for driving liquid crystals is provided in the step region A of the first, second glass substrates 31, 32, and the liquid-crystal driving wiring 35 and the output leads 23 (shown in FIG. 3) of the liquid-crystal-panel driver IC TCP are connected to each other via anisotropic conductive film (not shown).

Referring to FIG. 4, mutually adjoining liquid-crystal-panel driver IC TCPs are laid so as to overlap each other at the connecting slits 26A, 26B (shown in FIG. 3) and the input leads 24A, 24B are connected to each other by soldering or the like at the connecting slits 26A, 26B. As a result, the input connection board such as a flexible board or a printed board that is used to transmit input signals for the liquid-crystal-panel driver IC TCP of the first embodiment is no longer necessary.

Thus, it becomes possible to mount the liquid-crystal-panel driver IC TCPs compactly in a bent state on the liquid crystal panel 30 formed of the first, second glass substrates 31, 32. Therefore, the liquid-crystal-panel driver IC TCPs can be mounted compactly on the liquid crystal panel 30 without using any fixing jigs, allowing the picture-frame size to be reduced so that the liquid crystal panel module can be downsized. Furthermore, mutually adjoining liquid-crystal-panel driver IC TCPs are laid so as to overlap each other at parts of base tapes 21, 21 respectively having input leads 24A, 24B, and the input leads 24A, 24B of the corresponding liquid-crystal-panel driver IC TCPs are electrically connected to each other at the connecting slits 26A, 26B. As a result, the input connection board such as a flexible board or a printed board is no longer necessary, so that the step region A of the first, second glass substrates 31, 32 is further reduced, allowing the liquid crystal panel module to be further downsized and reduced in cost.

Also, since the liquid-crystal-panel driver IC TCPs are placed within the step region A of the first, second glass substrates 31, 32, the liquid crystal panel module can be further downsized.

Moreover, since the base tape 21 is used as the insulative base, the bending of the base tape 21 at the bending slit 5 can be easily achieved.

(Third Embodiment)

Figure 5:
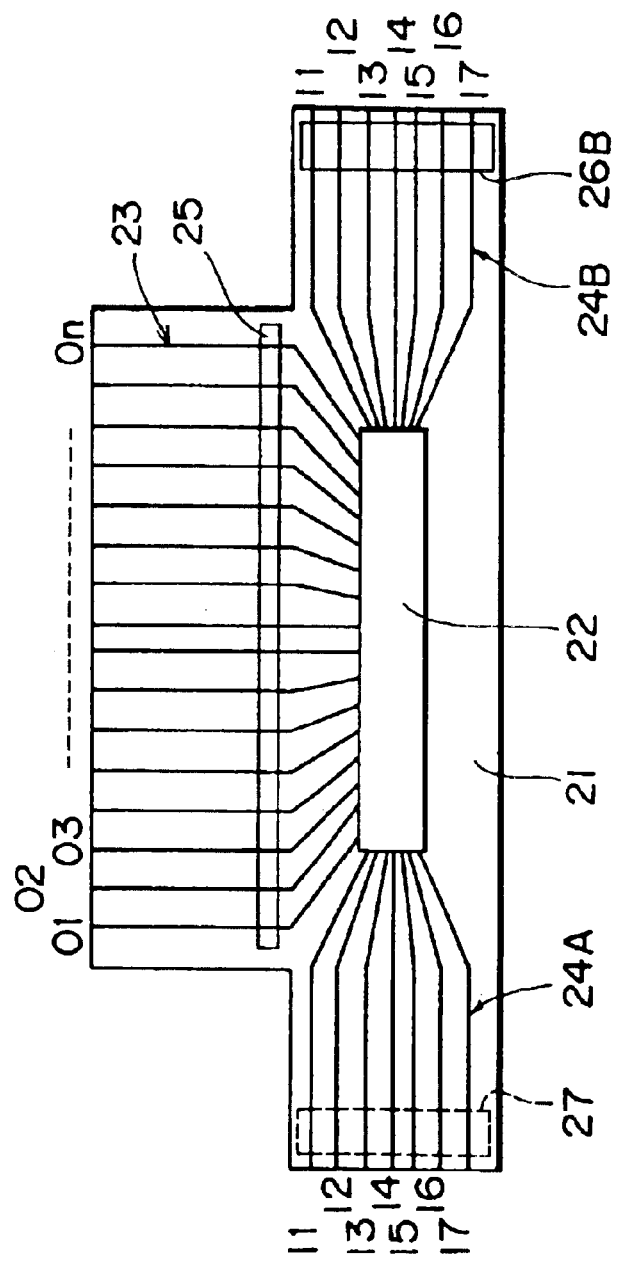
FIG. 5 is a plan view of a liquid-crystal-panel driver IC TCP according to a third embodiment of the present invention.

FIG. 5 is a plan view of a liquid-crystal-panel driver IC package to be mounted on a liquid crystal panel module according to a third embodiment of the present invention. In this case, the liquid-crystal-panel driver IC TCP and the liquid crystal panel module are similar in construction to those of the second embodiment except the connecting portion of input leads on one side of a liquid crystal driven chip 22, and the similar-construction portions are designated by like reference numerals and omitted in description, with FIG. 4 also referenced as an aid.

As shown in FIG. 5, a resist-uncoated connecting portion 27 is provided near ends of input leads 24A instead of the connecting slit. With the connecting slit 26B and the resist-uncoated connecting portion 27 of the liquid-crystal-panel driver IC TCP, outer leads of input leads 24B in the connecting slit 26B and outer leads of input leads 24A in the resist-uncoated connecting portion 27 are made directly connectable through soldering or other process by preparing a design that when liquid-crystal-panel driver IC TCPs are mounted on the liquid crystal panel 30 (shown in FIG. 4), mutually adjoining liquid-crystal-panel driver IC TCP overlap each other at the connecting slit 26B and the resist-uncoated connecting portion 27. Meanwhile, identical-signal terminals of the liquid crystal driver chip 22, to which the inner leads of the input leads 24A, 24B are connected, are electrically connected by internal wiring of the liquid crystal driver chip 22.

Figure 6:
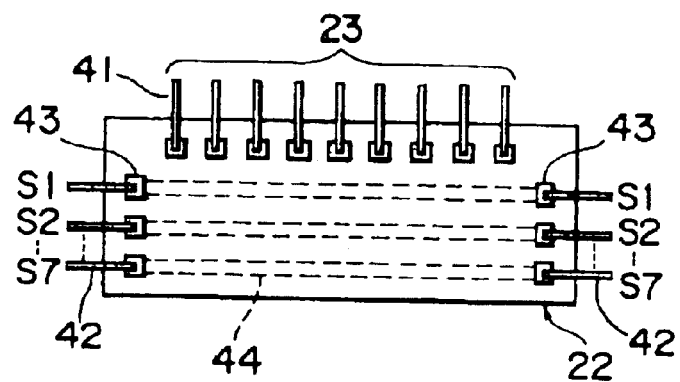
FIG. 6 is a plan view showing the bump side of a liquid crystal driver chip.

Details are shown in FIG. 6, which is a rear side view of the liquid crystal driver chip 22, as viewed from its bump side. Referring to FIG. 6, numeral 41 denotes inner leads of the output leads 23, and 42 denotes inner leads of the input leads 24A, 24B for input signals S1–S7. On right and left of the liquid crystal driver chip 22 are bumps 43 of identical-signal terminals, and the bumps 43 on both sides are connected to each other in input-signal correspondence by internal wiring (e.g., two-layer metallization) 44 of the liquid crystal driver chip 22.

Mounting form of the liquid-crystal-panel driver IC TCP shown in FIG. 5 in this third embodiment is similar to that of the second embodiment shown in FIG. 4, except the only difference that the connecting slit 26B and the resist-uncoated connecting portion 27 are connected to each other instead of the connection between the connecting slits of mutually adjoining liquid-crystal-panel driver IC TCPs.

Accordingly, in this third embodiment, the same effects as in the second embodiment are produced and moreover, because resist (for protection of wiring pattern) is removed only at the resist-uncoated connecting portion 27, base material of the base tape 21 of the liquid-crystal-panel driver IC TCP is left at the resist-uncoated connecting portion 27, so that both faces of the input leads 24A (wiring patterns) of the liquid-crystal-panel driver IC TCPs are not exposed, unlike the second embodiment. Accordingly, there is no fear for disconnections of the input leads 24A, 24B at the connecting slits 26B. Thus, the liquid-crystal-panel driver IC TCP can be made highly reliable and easy to handle.

Figure 7:
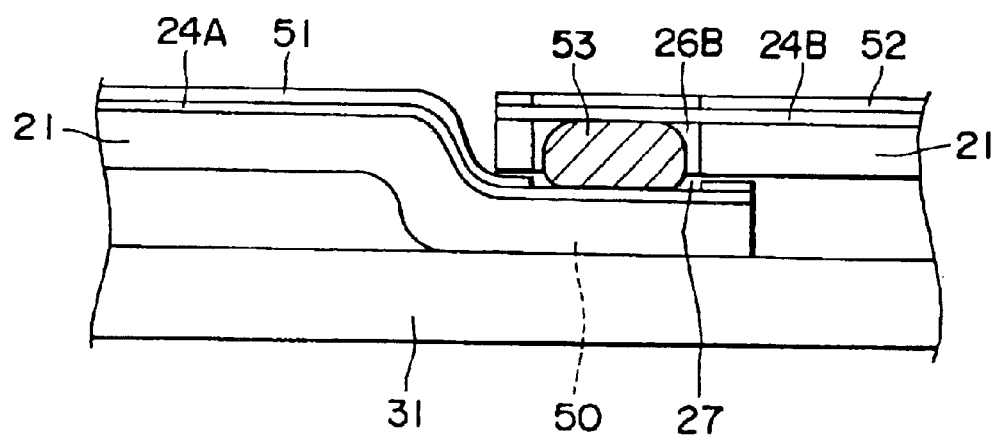
FIG. 7 is a sectional view as viewed from the line VII—VII of FIG. 4.

FIG. 7 is a sectional view corresponding to a sectional view as viewed from the line VII—VII of FIG. 4, i.e., a sectional view showing a state in which mutually adjoining liquid-crystal-panel driver IC TCPs are connected to each other so that the connecting slit 26B and the resist-uncoated connecting portion 27 overlap each other, in this third embodiment.

As shown in FIG. 7, on the first glass substrate 31, are laid the resist-uncoated connecting portion 27 of the input leads 24A side of one liquid-crystal-panel driver IC TCP and the connecting slit 26B of the input leads 24B side of the other liquid-crystal-panel driver IC TCP, in this order from below. Like this, after the connecting slit 26B and the resist-uncoated connecting portion 27 of mutually adjoining liquid-crystal-panel driver IC TCPs are laid so as to overlap each other, the input leads 24A, 24B are connected to each other by solder 53 in the connecting slit 26B and the resist-uncoated connecting portion 27. In addition, in FIG. 7, reference numerals 51, 52 denote solder resist. Also, a broken line portion shown in FIG. 7 indicates that the base tape material of the base tape is absent in this portion in the case of the second embodiment of FIG. 3.

In the first to third embodiments, electrically connected portions are not coated with solder resist. For example, the inner leads of the liquid-crystal-panel driver IC TCPs and the output leads 3, 23 (shown in FIGS. 1, 3 and 5) that need to be electrically connected to wiring of the first glass substrate 11, 31 are not coated with the solder resist.

Figure 8:
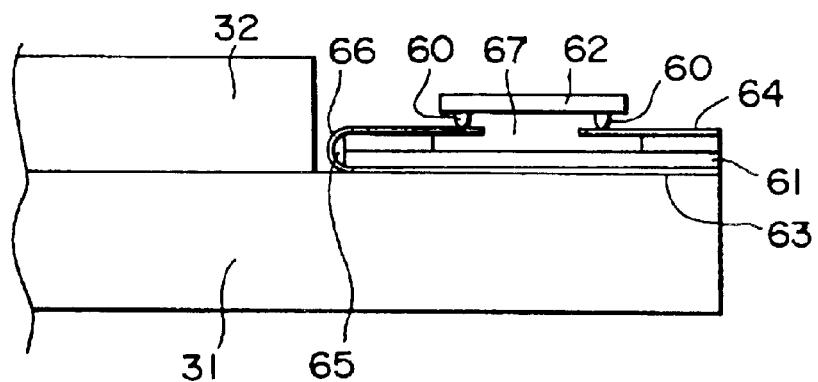
FIG. 8 is a sectional view as viewed from the line VIII—VIII of FIG. 4.

Also, in the first to third embodiments, as the base material of the base tape 1, 21 of the liquid-crystal-panel driver IC TCP, a polyimide film having a thickness of, for example, 50 µm is used, and an electrolytic copper foil having a thickness of 18 µm and a minimum line width of 30 µm as an example is stacked on the polyimide film with an adhesive layer interposed therebetween. Otherwise, the liquid-crystal-panel driver IC TCP may be one in which an electrolytic copper foil pattern, which is a conductor, is formed directly on the base material of the base tape without using any adhesive. For example, as shown in FIG. 8, a liquid crystal driver chip 62 is mounted on a base tape 61 with a device hole 67 formed therein, and bumps 60 on the liquid crystal driver chip 62 side and inner leads of a wiring pattern 64 on the base tape 61 are electrically connected to each other, and moreover the base tape 61 of the liquid-crystal-panel driver IC TCP is bent 180 degrees at a bending slit 65. Also, lower and upper wiring patterns 63, 64 are connected to each other via a wiring pattern 66 of the bending slit 65. It is noted that, in FIG. 8, anisotropic conductive film or solder resist for electrical connection between the first glass substrate 31 and the liquid-crystal-panel driver IC TCP, and resin mold for protection of the liquid crystal driver chip 62 are not shown for an easier viewing.

The liquid-crystal-panel driver IC package and the liquid crystal panel module of the present invention are not limited to those described in the first to third embodiments, and of course, may be changed in various ways without departing from the gist of the invention.

For example, the liquid-crystal-panel driver IC TCPs shown in FIGS. 2 and 4 may be mounted on a liquid crystal panel with the bending slit side directed outward, converse to the figures. Another possible form is that the liquid-crystal-panel driver IC (liquid crystal driver chip) is sandwiched by a bent base tape, flexible board or other insulative base.

Figure 9:
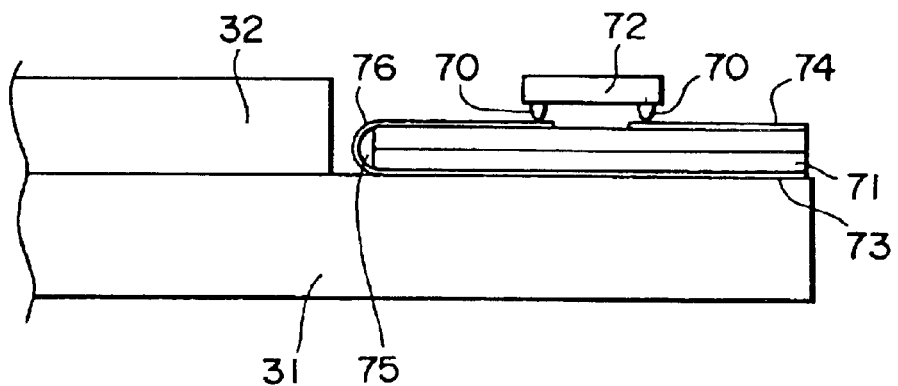
FIG. 9 is a sectional view of a liquid-crystal-panel driver IC package using a flexible board.
Figure 10:
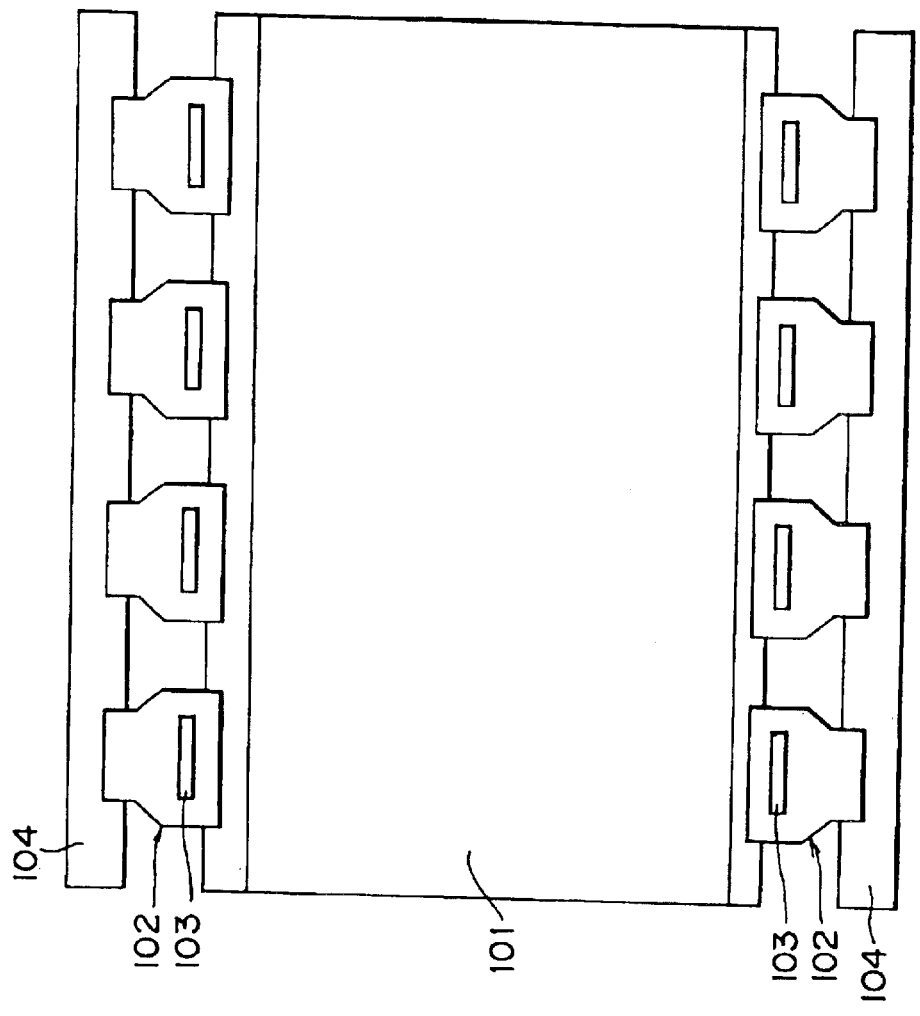
FIG. 10 is a plan view of a liquid crystal panel module according to the prior art.
Figure 11:
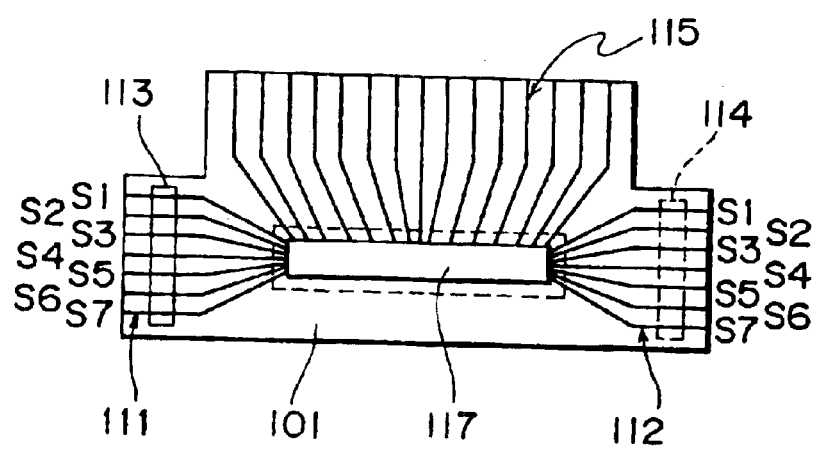
FIG. 11 is a plan view of a liquid-crystal-panel driver IC package mounted on the liquid crystal panel module.

Also, in the first to third embodiments, liquid-crystal-panel driver IC TCPs in which a base tape is used as the insulative base have been described. However, other than the base tape, a flexible board may be used as the insulative base. For example, FIG. 9 shows a sectional view in which a liquid-crystal-panel driver IC package using the flexible board as the insulative base is mounted on a liquid crystal panel formed of the first, second glass substrates 31, 32. This FIG. 9 is a sectional view corresponding to a sectional view as viewed from the line VIII—VIII of FIG. 4, where the liquid-crystal-panel driver IC TCP of FIG. 4 is replaced with a liquid-crystal-panel driver IC package using a flexible board.

As shown in FIG. 9, a liquid crystal driver chip 72 is mounted on a flexible board 71, and bumps 70 of the liquid crystal driver chip 72 are electrically connected to a wiring, pattern 74 on the flexible board 71, and moreover the flexible board 71 is bent 180° at a bending slit 75. Also, lower and upper wiring patterns 73, 74 are connected to each other via a wiring pattern 76 of the bending slit 75. It is noted that, in FIG. 9, anisotropic conductive film or solder resist for electrical connection between the first glass substrate 31 and the flexible board 71, and resin mold for protection of the liquid crystal driver chip 72 are not shown for an easier viewing.

For example, in the case of a liquid-crystal-panel driver IC TCP, when resin mold for protection of inner leads and bumps of the liquid-crystal-panel driver IC TCP hangs down below in the device hole of the liquid-crystal-panel driver IC TCP, bending the liquid-crystal-panel driver IC TCP to 180° would result in a state that upper and lower base tapes could not be laid on top of each other in a just fit, which would require care in resin molding process. However, using a flexible board instead of the base tape dissipates such anxiety, making the liquid-crystal-panel driver IC TCP easier to handle. Besides, because the upper and lower flexible boards meet together in a just fit at the 180° bending of the flexible board, the liquid-crystal-panel driver IC TCP can be made lower in height and mounted more compactly.

Further, in the first to third embodiments, the first glass substrate 11, 31 and the second glass substrate 12, 32 have been laminated together to form a step region A at one-side edges of the first, second glass substrates 11, 12; 31, 32. Otherwise, the step region may also be provided at two or more side edges of the first, second substrates depending on the makeup of the liquid crystal panel or the like.

Further, in the second and third embodiments, the bumps 43 for identical-signal terminals on right and left of the liquid crystal driver chip 22 have been connected to each other in input-signal correspondence by the internal wiring 44 of the liquid crystal driver chip 22. Otherwise, the input leads may also be connected by the wiring pattern on the insulative base.

As apparent from the foregoing description, in the liquid-crystal-panel driver IC package of the present invention, a liquid-crystal-panel driver IC is mounted on an insulative base, output leads connected to the liquid-crystal-panel driver IC are provided on one side of the liquid-crystal-panel driver IC on the insulative base, and input leads connected to the liquid-crystal-panel driver IC are provided on the other side of the liquid-crystal-panel driver IC on the insulative base. Further, a bending slit is provided on one side of the insulative base where the output leads are provided.

Therefore, according to the liquid-crystal-panel driver IC package of this invention, the liquid-crystal-panel driver IC package can be mounted compactly in a bent state on a liquid crystal panel without using any fixing jigs, by bending the insulative base at the bending slit provided on the output leads side of the insulative base; and by connecting the main part of the output leads to the wiring on the liquid crystal panel side while the main part of the output leads to be connected to the liquid crystal panel is positioned on the rear side.

Also, in the liquid-crystal-panel driver IC package of one embodiment, since the insulative base is a base tape, the bending of the base tape at the bending slit can be easily achieved.

Also, in the liquid-crystal-panel driver IC package of one embodiment, since the insulative base is a flexible board, there are no device holes into which resin mold would hang down, making the liquid-crystal-panel driver IC package easier to handle. Besides, since there are no swells of resin mold to be filled into such a device hole, upper and lower parts of the flexible board can be laid on each other without gaps when the flexible board is bent. Thus, the liquid-crystal-panel driver IC package can be made lower in height and mounted more compactly.

Also, in the liquid-crystal-panel driver IC package of one embodiment, the input leads comprise first and second input leads which are provided on the insulative base so as to extend bilaterally outwardly generally perpendicularly to a direction in which the output leads extend from the liquid-crystal-panel driver IC, and connecting slits are provided on the first and second input leads sides of the insulative base, respectively. Therefore, when this liquid-crystal-panel driver IC package is set to the liquid crystal panel so as to make an array in some plural number, mutually adjoining liquid-crystal-panel driver IC packages are laid out so as to overlap each other at the first and second input leads sides of the insulative base, and the first and second input leads can be electrically connected to each other at the connecting slits, by which the need for the connection board such as a flexible board or a printed board is eliminated. Thus, the liquid-crystal-panel driver IC package can be further downsized and reduced in cost.

Also, in the liquid-crystal-panel driver IC package of one embodiment, the input leads comprise first and second input leads which are provided on the insulative base so as to extend bilaterally outwardly generally perpendicularly to a direction in which the output leads extend from the liquid-crystal-panel driver IC, a connecting slit is provided on the first input leads side of the insulative base, and a resist-uncoated connecting portion is provided on the second input leads side of the insulative base. Therefore, when this liquid-crystal-panel driver IC package is set to the liquid crystal panel so as to make an array in some plural number, mutually adjoining liquid-crystal-panel driver IC packages are laid out so as to overlap the first and second input leads sides of the insluative base, and the first and second input leads are electrically connected to each other at the connecting slit and the resist-uncoated connecting portion, by which the need for the connection board such as a flexible board or a printed board is eliminated. Thus, the liquid-crystal-panel driver IC package can be further downsized and reduced in cost. Moreover, by the provision of the resist-uncoated connecting portion on the second input leads side of the insulative base, disconnections of the first and second input leads where this connecting portion is provided can be prevented. Thus, the liquid-crystal-panel driver IC package can be further improved in reliability and made easier to handle.

Also, in the liquid-crystal-panel driver IC package of one embodiment, the liquid-crystal-panel driver IC has two identical-signal terminals to which the first and second input leads are connected, respectively, and the two identical-signal terminals are electrically connected to each other within the liquid-crystal-panel driver IC. Therefore, when this liquid-crystal-panel driver IC package is set to the liquid crystal panel so as to make an array in some plural number, the first and second input leads of mutually adjoining liquid-crystal-panel driver IC packages can be connected to each other via the liquid-crystal-panel driver ICs without any connecting lines.

Also, in the liquid crystal panel module of one embodiment, which is a liquid crystal panel module in which the liquid-crystal-panel driver IC packages are mounted so as to be arrayed in some plural number, a first glass substrate and a second glass substrate are laminated together with a specified spacing so as to form, on at least one edge side of the first, second glass substrates, a step region for setting therein the liquid-crystal-panel driver IC packages in which the insulative base is bent over at the bending slit and folded, and to seal liquid crystals therebetween. Further, output leads of the individual liquid-crystal-panel driver IC packages disposed so as to be arrayed along the step region are electrically connected to liquid-crystal driving wiring provided in the step region of the first, second glass substrates. Moreover, input leads of the individual panel driver IC packages are electrically connected to each other via connection wiring of connection boards set on the individual panel driver IC packages.

Therefore, according to the liquid crystal panel module of this embodiment, the liquid-crystal-panel driver IC packages can be mounted compactly on the liquid crystal panel formed of the first, second glass substrates without using any fixing jigs. Thus, a liquid crystal panel module that can be downsized by reducing the picture-frame size and that just meets user's needs can be provided.

Also, in the liquid crystal panel module of one embodiment, which is a liquid crystal panel module in which the liquid-crystal-panel driver IC packages are mounted so as to be arrayed in some plural number, a first glass substrate and a second glass substrate are laminated together with a specified spacing so as to seal liquid crystals therebetween and to form, on at least one edge side of the first, second glass substrates, a step region for setting therein the liquid-crystal-panel driver IC packages in which each insulative base is bent over at the bending slit and folded. Further, output leads of the individual liquid-crystal-panel driver IC packages disposed so as to be arrayed along the step region are electrically connected to liquid-crystal driving wiring provided in the step region of the first, second glass substrates. Moreover, the connecting slits of mutually adjoining liquid-crystal-panel driver IC packages are laid on each other, so that first and second input leads are electrically connected to each other by the connecting slits.

Therefore, according to the liquid crystal panel module of this embodiment, the liquid-crystal-panel driver IC packages can be mounted compactly on the liquid crystal panel formed of the first, second glass substrates without using any fixing jigs. Thus, a liquid crystal panel module that can be downsized by reducing the picture-frame size and that just meets user's needs can be provided. Also, the first and second input leads of mutually adjoining liquid-crystal-panel driver IC packages are laid on each other, so that the first and second input leads of the liquid-crystal-panel driver IC packages are electrically connected to each other at the connecting slits. Thus, the need for the connection board such as a flexible board or a printed board is eliminated, and the liquid crystal panel module can be further downsized and reduced in cost.

Also, in the liquid crystal panel module of one embodiment, which is a liquid crystal panel module on which liquid-crystal-panel driver IC packages are mounted so as to be arrayed in some plural number, a first glass substrate and a second glass substrate are laminated together with a specified spacing so as to seal liquid crystals therebetween and to form, on at least one edge side of the first, second glass substrates, a step region for setting therein the liquid-crystal-panel driver IC packages in which each insulative base is bent over at the bending slit and folded. Further, the output leads of the liquid-crystal-panel driver IC packages disposed so as to be arrayed along the step region are electrically connected to liquid-crystal driving wiring provided in the step region of the first, second glass substrates. Moreover, the connecting slits and the resist-uncoated connecting portions of mutually adjoining liquid-crystal-panel driver IC packages are laid on each other, so that the first and second input leads are electrically connected to each other at the connecting slits and the resist-uncoated connecting portions.

Therefore, according to the liquid crystal panel module of this embodiment, the liquid-crystal-panel driver IC packages can be mounted compactly on the liquid crystal panel formed of the first, second glass substrates without using any fixing jigs. Thus, a liquid crystal panel module that can be downsized by reducing the picture-frame size and that just meets user's needs can be provided. Also, the first and second input leads sides of the mutually adjoining liquid-crystal-panel driver IC packages are laid on each other, so that the first and second input leads are electrically connected to each other by the connecting slits and the resist-uncoated connecting portion provided on the insulative base. Thus, the need for the connection board such as a flexible board or a printed board is eliminated, and the liquid crystal panel module can be further downsized and reduced in cost. Moreover, since the liquid-crystal-panel driver IC package has the resist-uncoated connecting portion on the second input leads side of the insulative base, disconnections of the first and second input leads where this resist-uncoated connecting portion is provided can be prevented. Thus, the liquid-crystal-panel driver IC package can be further improved in reliability and made easier to handle.

Also, in the liquid crystal panel module of one embodiment, since the liquid-crystal-panel driver IC package is placed in the step region of the first, second glass substrates, the liquid crystal panel module can be further downsized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid-crystal-panel driver integrated circuit (IC) package comprising:
    an insulative base;
    a liquid-crystal-panel driver IC mounted on the insulative base;
    output leads which are provided on the insulative base on one side of the liquid-crystal-panel driver IC, and which are connected to the liquid-crystal-panel driver IC; and
    input leads which are provided on the insulative base on the other side of the liquid-crystal-panel driver IC, and which are connected to the liquid-crystal-panel driver IC, the input leads comprising first input leads and second input leads which are respectively provided on the insulative base so as to extend bilaterally outwardly generally perpendicularly to a direction in which the output leads extend from the liquid-crystal-panel driver IC,
    a bending slit is provided on part of the insulative base where the output leads are provided such that the output leads remain in the bending slit,
    connecting slits which are respectively provided on parts of the insulative base where the first and second input leads are provided, respectively, such that the first and second input leads are exposed in the connecting slits.

2. The liquid-crystal-panel driver IC package according to claim 1, wherein
    the liquid-crystal-panel driver IC has two identical-signal terminals to which the first and second input leads are connected, respectively, and
    the two identical-signal terminals are electrically connected to each other within the liquid-crystal-panel driver IC.

3. The liquid crystal panel module in which the liquid-crystal-panel driver integrated circuit (IC) packages as defined in claim 1 are assembled so as to make an array, the liquid crystal panel module comprising:
    a first glass substrate and a second glass substrate laminated together with a specified spacing so as to seal liquid crystals therebetween, and to form, on at least one edge side of the first, second glass substrates, a step region for setting therein the liquid-crystal-panel driver IC packages in which each insulative base is bent at the bending slit and folded; and
    liquid-crystal driving wiring which is provided in the step region of the first, second glass substrates, and to which the output leads of the individual liquid-crystal-panel driver IC packages disposed so as to be arrayed along the step region am electrically connected, wherein
    the connecting slits of mutually adjoining liquid-crystal-panel driver IC packages are superimposed on each other so that the first input leads and second input leads of the liquid-crystal-panel driver IC packages are electrically connected to each other at the connecting slits.

4. A liquid crystal panel module comprising:
    a first substrate;
    a second substrate;
    liquid crystal sealed between the first substrate and the second substrate;
    an edge of the first substrate protruding beyond the second substrate to form a step region of the first substrate;
    wiring for driving the liquid crystals being provided in the step region;
    plural driver integrated circuit (IC) packages situated in the step region, the plural packages each comprising:
        an insulative base;
        a driver integrated circuit (IC) mounted on the insulative base;
        output leads which are provided on the insulative base and which are connected to the driver integrated circuit (IC);
        a bending slit provided on part of the insulative base where the output leads are provided such that the output leads remain in the bending slit;
            the insulative base being folded substantially one hundred eighty degrees at the bending slit into a folded configuration to define an upper base folded portion which overlies a lower base folded portion, the base in the folded configuration being oriented so that the driver integrated circuit (IC) is mounted on an upper surface of the upper base folded portion and so that the output leads extend on a lower surface of the lower base folded portion for contacting relation with the wiring in the step region;
    further comprising, for each of the plural packages:
    input leads which are provided on the insulative base and which are connected to the driver integrated circuit (IC), the input leads comprising first input leads and second input leads which are respectively provided on the insulative base so as to extend bilaterally outwardly generally perpendicularly to a direction in which the output leads extend from the driver integrated circuit (IC),
    connecting slits which are respectively provided on parts of the insulative base where the first and second input leads are provided, respectively, such that the first and second input leads are exposed in the connecting slits.

5. The apparatus of claim 4, wherein the connecting slits of adjacent ones of the plural packages are situated in overlapping relation.

6. A liquid crystal panel module comprising:
    a first substrate;
    a second substrate;
    liquid crystals sealed between the first substrate and the second substrate;
    an edge of the first substrate protruding beyond the second substrate to form a step region of the first substrate;

wiring for driving the liquid crystals being provided in the step region;

plural driver integrated circuit (IC) packages situated in the step region, the plural packages each comprising:
an insulative base;
a driver integrated circuit (IC) mounted on the insulative base;
output leads which are provided on the insulative base and which are connected to the driver integrated circuit (IC);
a bending slit provided on part of the insulative base where the output leads are provided such that the output leads remain in the bending slit;
the insulative base being folded substantially one hundred eighty degrees at the bending slit into a folded conflation to define an upper base folded portion which overlies a lower base folded portion, the base in the folded configuration being oriented so that the driver integrated circuit (IC) is mounted on an upper surface of the upper base folded portion and so that the output leads extend on a lower surface of the lower base folded portion for contacting relation with the wiring in the step region;

further comprising, for each of the plural packages:

input leads which are provided on the insulative base and which are connected to the driver integrated circuit (IC), the input leads comprising first input leads and second input leads which are respectively provided on the insulative base so as to extend bilaterally outwardly generally perpendicularly to a direction in which the output leads extend from the driver integrated circuit (IC), a connecting slit provided on one part of the insulative base where the first input leads are provided such that the first input leads are exposed in the connecting slit, and a resist-uncoated connected portion is provided on another part of the insulative base where the second input leads are provided.

* * * * *